(12) United States Patent
Tsao et al.

(10) Patent No.: US 10,395,997 B2
(45) Date of Patent: Aug. 27, 2019

(54) SEMICONDUCTOR PROCESS

(71) Applicant: ADVANCED SEMICONDUCTOR ENGINEERING, INC., Kaohsiung (TW)

(72) Inventors: Yu-Cheng Tsao, Kaohsiung (TW); Cheng-Hung Wang, Kaohsiung (TW); Chun-Chieh Lin, Kaohsiung (TW); Hsiu-Hsiung Yang, Kaohsiung (TW); Yu-Pin Tsai, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 15/409,434

(22) Filed: Jan. 18, 2017

(65) Prior Publication Data
US 2017/0125310 A1    May 4, 2017

Related U.S. Application Data

(63) Continuation of application No. 14/494,449, filed on Sep. 23, 2014, now Pat. No. 9,564,376.

(30) Foreign Application Priority Data

Nov. 8, 2013   (TW) .............................. 102140733 A (51) Int. Cl.
*H01L 21/66* (2006.01)
*H01L 21/683* (2006.01)
(Continued)

(52) U.S. Cl.
CPC .......... *H01L 22/14* (2013.01); *H01L 21/6835* (2013.01); *H01L 21/78* (2013.01);
(Continued)

(58) Field of Classification Search
None
See application file for complete search history.

(56) References Cited

U.S. PATENT DOCUMENTS 6,455,353 B2   9/2002   Lin
7,354,802 B1   4/2008   Poddar et al.
(Continued)

FOREIGN PATENT DOCUMENTS

CN    1930261 A     3/2007
JP    2000-299360 A  10/2000
(Continued)

OTHER PUBLICATIONS

Non-Final Office Action for corresponding U.S. Appl. No. 14/494,449, dated Feb. 11, 2016.
(Continued)

*Primary Examiner* — Long Pham
(74) *Attorney, Agent, or Firm* — Foley & Lardner LLP; Cliff Z. Liu

(57) ABSTRACT

The present disclosure relates to a semiconductor process, which includes: (a) providing a semiconductor element; (b) attaching the semiconductor element to a carrier by an adhesive layer, so that the adhesive layer is sandwiched between the semiconductor element and the carrier; and (c) cutting the semiconductor element to form a plurality of semiconductor units. Thereby, the gaps between the semiconductor units are fixed after the cutting process, so as to facilitate testing the semiconductor units.

20 Claims, 11 Drawing Sheets

(51) Int. Cl.
*H01L 21/78* (2006.01)
*H01L 23/00* (2006.01)

(52) U.S. Cl.
CPC ............... *H01L 24/05* (2013.01); *H01L 24/11* (2013.01); *H01L 24/13* (2013.01); *H01L 2221/68327* (2013.01); *H01L 2221/68381* (2013.01); *H01L 2224/05569* (2013.01); *H01L 2224/05572* (2013.01); *H01L 2224/11* (2013.01); *H01L 2224/131* (2013.01); *H01L 2224/13022* (2013.01); *H01L 2224/13024* (2013.01); *H01L 2224/94* (2013.01)

(56) References Cited

U.S. PATENT DOCUMENTS

| | | |
|---|---|---|
| 7,388,385 B1 | 6/2008 | Iacob |
| 7,719,301 B2 | 5/2010 | Tsuchida et al. |
| 7,811,647 B2 | 10/2010 | Arimitsu et al. |
| 8,518,749 B2 | 8/2013 | Dahilig et al. |
| 2004/0006404 A1 | 1/2004 | McAdams et al. |
| 2009/0237104 A1 | 9/2009 | Tsuchida et al.ke |
| 2009/0294913 A1 | 12/2009 | Kawashima |
| 2013/0120018 A1 | 5/2013 | Hou et al. |

FOREIGN PATENT DOCUMENTS

| | | | |
|---|---|---|---|
| JP | 02000288926 | * | 10/2000 |
| TW | 200508627 | | 3/2005 |
| TW | 200737329 | | 10/2007 |

OTHER PUBLICATIONS

Final Office Action for corresponding U.S. Appl. No. 14/494,449, dated Jul. 19, 2016.
Notice of Allowance for corresponding U.S. Appl. No. 14/494,449, dated Sep. 26, 2016.
Office Action with Search Report from related Chinese Patent Application No. 201510611091.7 dated Nov. 14, 2017, 12 pages.
Office Action for corresponding Chinese Patent Application No. 201510611091.7, dated Sep. 3, 2018, 7 pages.
Search Report for corresponding Chinese Patent Application No. 201510611091.7, dated Sep. 3, 2018, 4 pages.
Jin, De-Xuan et al."Very-Large-Scale Integration Technology", Nov. 30, 1985, 5 pages.

* cited by examiner

SEMICONDUCTOR PROCESS

CROSS REFERENCE TO RELATED APPLICATIONS

This application is a continuation of U.S. patent application Ser. No. 14/494,449, filed 23 Sep. 2014, which claims the benefit of Taiwan Patent Application No. 102140733, filed 8 Nov. 2013, the contents of which are incorporated herein by reference in their entireties.

BACKGROUND

1. Technical Field

The present disclosure relates to a semiconductor process. In particular, the present disclosure relates to a semiconductor cutting and testing process.

2. Description of the Related Art

In a conventional product test method for a wafer before a cutting process, the wafer is directly placed in a device for a probe test, wherein multiple dice in multiple unit regions can be tested simultaneously; however, this method cannot detect a work defect after the wafer is cut. The reason is described as follows.

In a conventional product test method for a wafer after a cutting process, the wafer is placed on a cut tape, wherein the circumference of the cut tape is fixed by an annular film frame. After the wafer is cut, a plurality of separated dice are formed. Under a traverse pulling force on the cut tape exerted by the film frame, the dice are stretched traversely resulting in a position offset, that is, the gaps between the dice are increased after the cutting process. Also, such offsets accumulate, that is, an offset amount becomes larger for a die at the periphery. Because the positions of the probes of a probe head are fixed, when an offset amount of a die exceeds a value, the probe becomes unable to simultaneously test the same number of multiple dice in multiple unit regions before cutting; therefore, the work efficiency of the conventional product test method decreases. In one example, in a conventional product test method, before the wafer is cut, multiple dice in 15 unit regions may be tested simultaneously; however, after the wafer is cut, multiple dice in only 4 unit regions may be tested simultaneously because of the above-mentioned offset amount. Thus, units per hour (UPH) of a test table is undesirably reduced.

SUMMARY

An aspect of the present disclosure relates to a semiconductor process. In an embodiment, the semiconductor process includes: (a) providing a semiconductor element; (b) attaching the semiconductor element to a carrier by an adhesive layer, so that the adhesive layer is sandwiched between the semiconductor element and the carrier; and (c) cutting the semiconductor element to form a plurality of semiconductor element units. Thereby, the gaps between the semiconductor element units are fixed after the cutting process, so as to facilitate testing the semiconductor element units. An offset amount between the semiconductor element units may be smaller than 4 µm.

In an embodiment, in (a), the semiconductor element is a wafer; in (b), the carrier is a glass, metal or dummy wafer, and a diameter of the carrier is substantially the same as a diameter of the semiconductor element; the adhesive layer is a double-sided tape, a diameter of which is substantially the same as that of the carrier.

In an embodiment, in (a), the semiconductor element is a strip (Strip); in (b), the carrier is a glass, metal or dummy wafer, and the carrier is a circular disk; the adhesive layer is a double-sided tape, a shape and a diameter of which are substantially the same as a respective shape and a respective diameter of the carrier.

In an embodiment, in (c), the pitches between each two of the semiconductor element units are substantially the same.

In an embodiment, in (b), the semiconductor element has an active surface and a rear surface; (b) further includes grinding the rear surface of the semiconductor element, and attaching the ground rear surface of the semiconductor element to the carrier using the adhesive layer.

In an embodiment, in (b), the semiconductor element has an active surface and a rear surface; the adhesive layer is first attached to the rear surface of the semiconductor element, and subsequently the carrier is attached to the adhesive layer.

In an embodiment, in (b), the semiconductor element has an active surface and a rear surface; the adhesive layer is first attached to the carrier, and subsequently the rear surface of the semiconductor element is attached to the adhesive layer.

In an embodiment, in (c), cutting the semiconductor element includes cutting the adhesive layer.

In an embodiment, after (c), the process further includes: (d) testing the semiconductor element units.

In an embodiment, after (d), the process further includes: (e) releasing the adhesiveness of the adhesive layer.

In an embodiment, (a) includes testing the semiconductor element by using a test apparatus, and wherein the semiconductor element has a plurality of cutting lines and the cutting lines define multiple unit regions; and in (c), the semiconductor element is cut along the cutting lines to form the semiconductor element units.

In an embodiment, the semiconductor process further includes: (d) testing the semiconductor element units by using the test apparatus; and (e) comparing a test result of (a) and a test result of (d). In this embodiment, the number of the semiconductor element units tested by the test apparatus in (d) is the same as the number of the unit regions tested by the test apparatus in (a).

Another aspect of the present disclosure relates to a semiconductor process. In an embodiment, the semiconductor process includes the following: (a) providing an object to be tested, where the object to be tested includes a plurality of semiconductor element units, an adhesive layer, and a carrier, and the semiconductor element units are attached to the carrier by the adhesive layer; and (b) testing the semiconductor element units by using a test apparatus.

DETAILED DESCRIPTION

Figure 1:
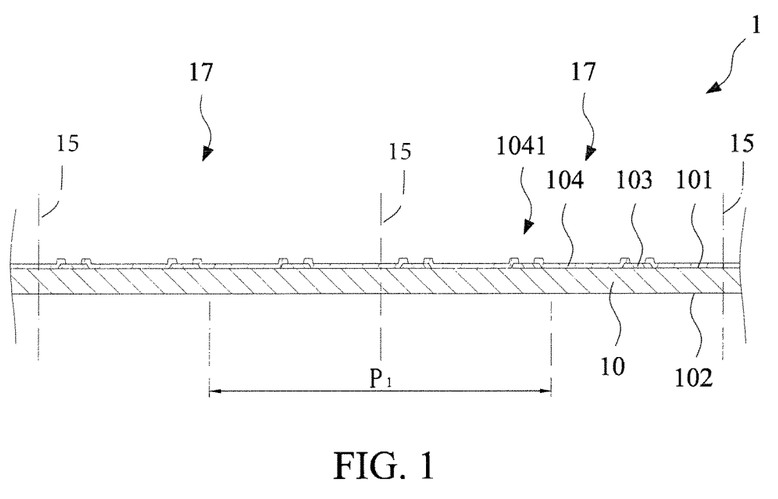
FIG. 1, FIG. 1a, FIG. 1b, FIG. 2, FIG. 3, FIG. 3a, FIG. 3b, FIG. 4, FIG. 5, FIG. 6, FIG. 7, FIG. 8, FIG. 8a, FIG. 9, and FIG. 10 are schematic views of a semiconductor process according to an embodiment of the present disclosure.

FIG. 1 to FIG. 10 are schematic views of a semiconductor process according to an embodiment of the present disclosure. Referring to FIG. 1, a semiconductor element 1 is provided. FIG. 1 is a partial schematic sectional view of the semiconductor element 1. In this embodiment, the semiconductor element 1 is a wafer, which includes a semiconductor element body 10, a plurality of pads 103, a passivation layer 104, and a plurality of cutting lines 15. The material of the semiconductor element body 10 may be, for example, a semiconductor material such as silicon, germanium, and gallium arsenide. The semiconductor element body 10 has an upper surface 101 and a lower surface 102. The pads 103 are located at the upper surface 101 of the semiconductor element body 10. The passivation layer 104 covers the upper surface 101 of the semiconductor element body 10 and a part of the pads 103, and has a plurality of passivation layer openings 1041 to expose the other part of the pads 103. The cutting lines 15 define a plurality of unit regions 17, and a pitch between two nearest neighbor unit regions 17 is defined as a first pitch $P_1$.

Figure 1A:
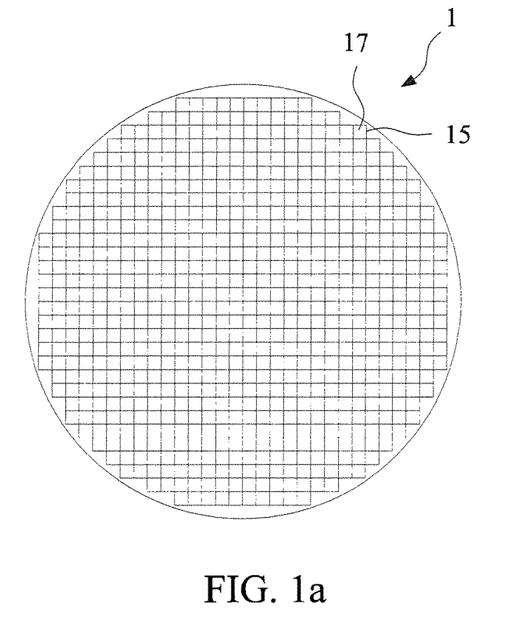

FIG. 1a is a top view of a semiconductor element according to an embodiment of the present disclosure. In this embodiment, the semiconductor element 1 is a wafer, which has a shape of a circular disk.

Figure 1B:
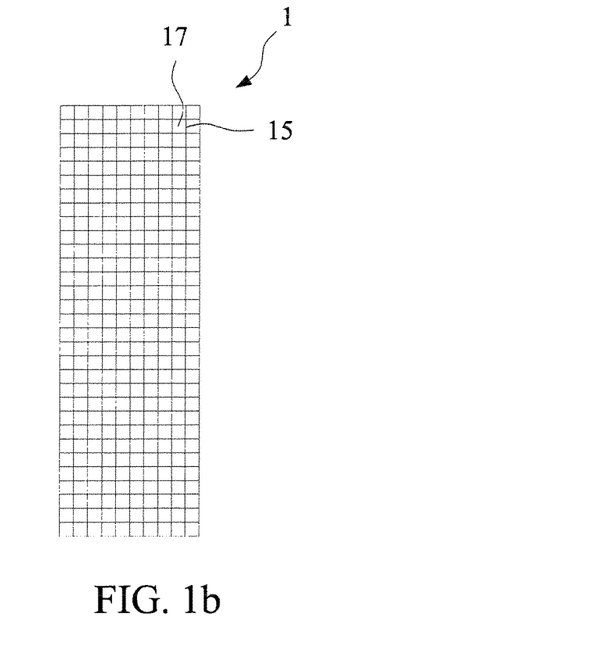

FIG. 1b is a top view of a semiconductor element according to another embodiment of the present disclosure. In this embodiment, the semiconductor element 1 is a strip, which is rectangular.

Figure 2:
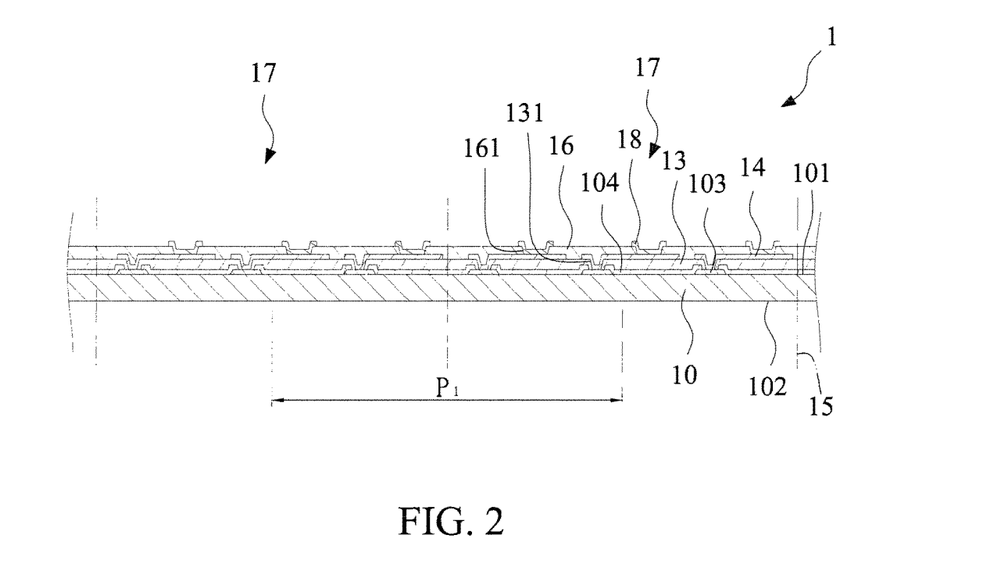

Referring to FIG. 2, a first protection layer 13 is formed to cover a part of pads 103 and the passivation layer 104, and the first protection layer 13 has a plurality of first openings 131 to expose the other part of the pads 103. In this embodiment, the material of the first protection layer 13 is polyimide. In other embodiments, the material of the first protection layer 13 is another polymer or resin, nanocomposite, or a combination of such. Next, a redistribution layer (RDL) 14 is formed on the first protection layer 13 and in its first openings 131 to contact the pads 103. The material of the RDL 14 is conductive; for example, copper or another metal, or other conductive materials, or a combination of such. Next, a second protection layer 16 is formed to cover the RDL 14 and the first protection layer 13, wherein the second protection layer 16 has a plurality of second openings 161 to expose a part of the RDL 14. Next, an under bump metallurgy (UBM) layer 18 is formed in the second openings 161 to contact the RDL 14.

Figure 3:
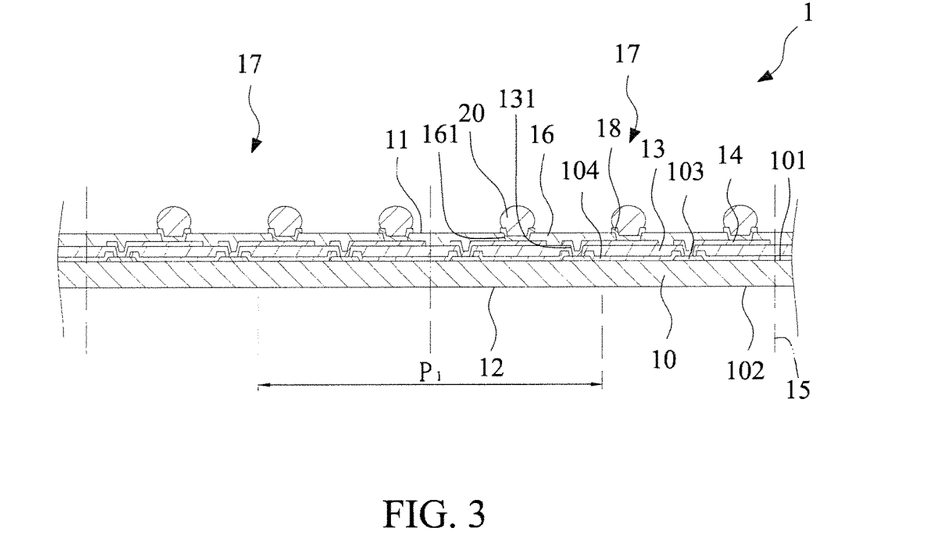

Referring to FIG. 3, a plurality of solder balls 20 is formed on the UMB layer 18. Meanwhile, the semiconductor element 1 has an active surface 11 and a rear surface 12. The active surface 11 is a surface that includes the RDL 14 and the solder balls 20. The rear surface 12 includes the lower surface 102 of the semiconductor element body 10.

Figure 3A:
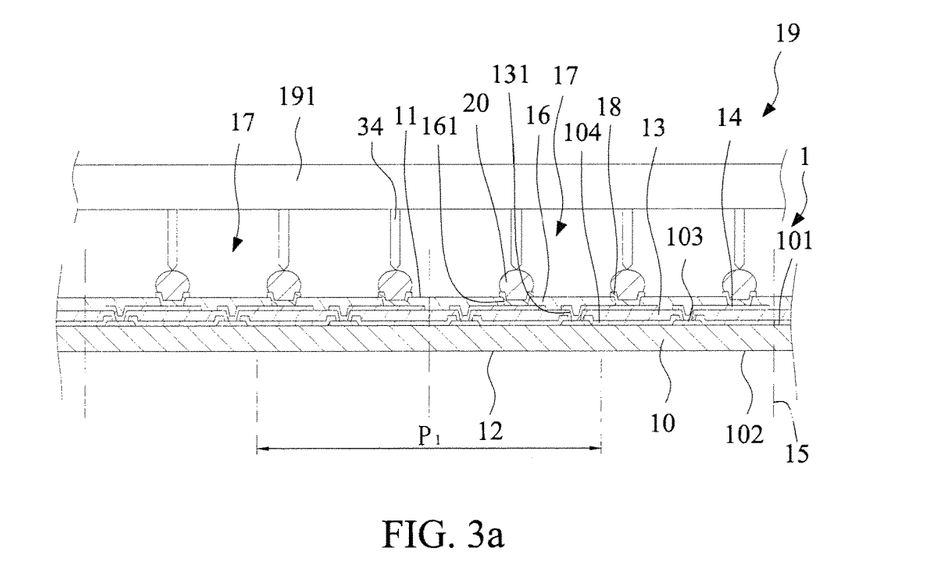

Referring to FIG. 3a, a test setup for a first test is illustrated. In this embodiment, a test apparatus 19 is used to test the semiconductor element 1. The test apparatus 19 includes a probe head 191 and a plurality of probes 34. The probes 34 are connected to the probe head 191, and the positions of the probes 34 are fixed. In this embodiment, the probes 34 are used to test electrical properties of the unit regions 17 of the semiconductor element 1 through the solder balls 20 on the unit regions 17 of the semiconductor element 1.

Figure 3B:
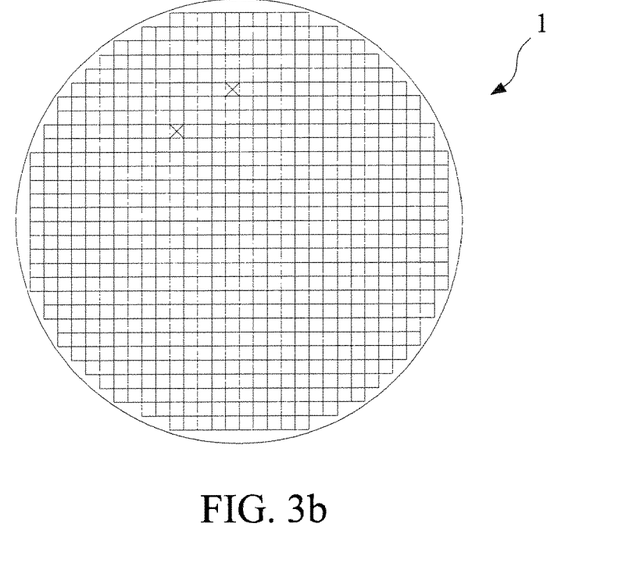

Referring to FIG. 3b, an example of a map of a test result of the first test using the test setup illustrated in FIG. 3a is shown. In this example shown in FIG. 3b, two regions of semiconductor element 1 marked by "x" represent two unit regions 17 that did not pass the electrical property testing using the test setup illustrated in FIG. 3a; that is, the two marked unit regions 17 are defective.

Figure 4:
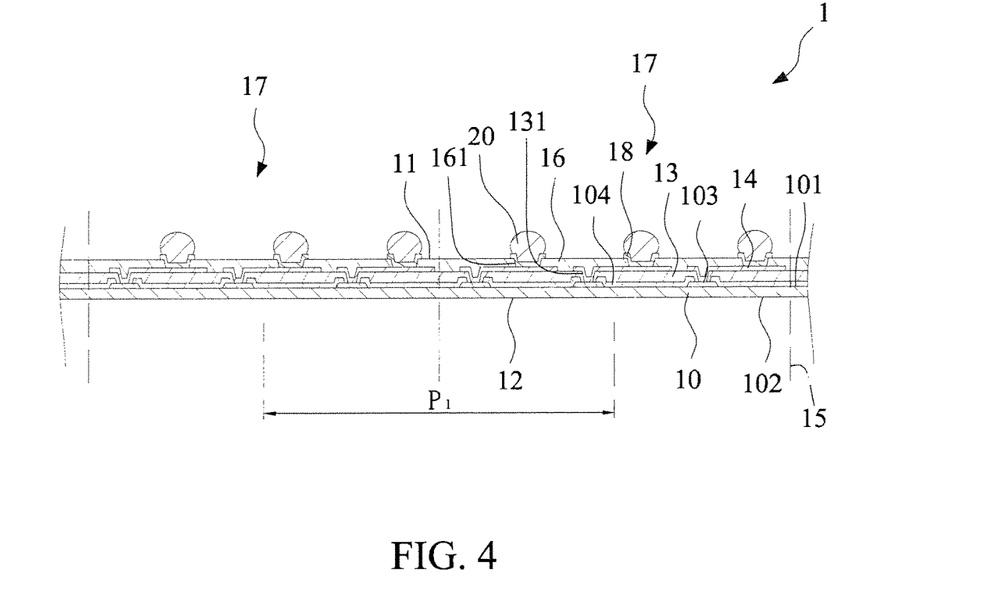

Referring to FIG. 4, the semiconductor element body 10 of semiconductor element 1 is thinned. In this embodiment, the rear surface 12 of the semiconductor element 1 (i.e., including the lower surface 102 of the semiconductor element body 10) is ground to thin the semiconductor element body 10, and improve the flatness of the rear surface 12 of the semiconductor element 1.

Figure 5:
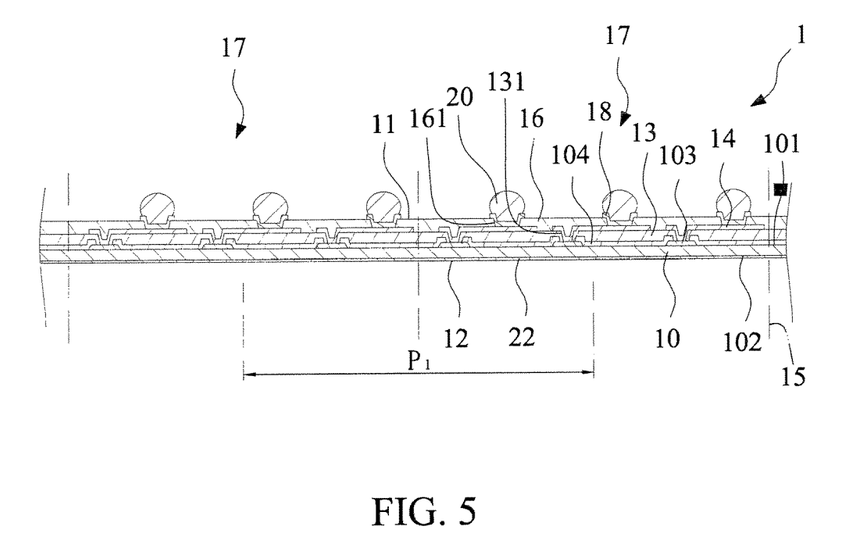

Referring to FIG. 5, a protection adhesive 22 is attached to the rear surface 12 of the semiconductor element 1 (i.e., including the lower surface 102 of the semiconductor element body 10). It can be understood that this step may be omitted, that is, the protection adhesive 22 may not be attached. It should be noted that if the protection adhesive 22 is attached, the rear surface 12 of the semiconductor element 1 becomes a lower surface of the protection adhesive 22. If the protection adhesive 22 is not attached, the rear surface 12 of the semiconductor element 1 is the lower surface 102 of the semiconductor element body 10.

Figure 6:
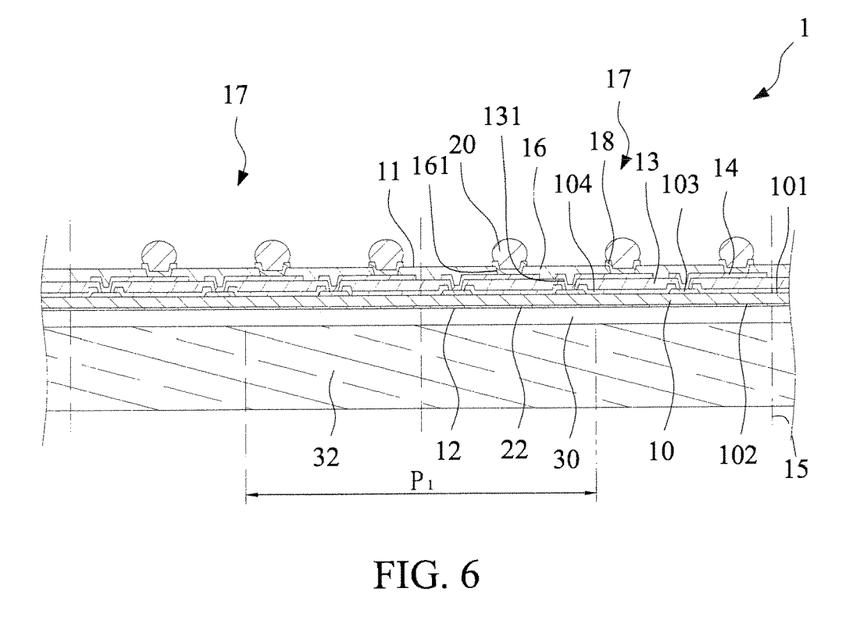

Referring to FIG. 6, the semiconductor element 1 is attached to a carrier 32 by an adhesive layer 30, and the carrier 32 is a circular disk, so that the adhesive layer 30 is sandwiched between the semiconductor element 1 and the carrier 32. In this embodiment, the semiconductor element 1 is a wafer, the carrier 32 is a glass, metal, acrylic or dummy wafer, and the size of the carrier 32 is substantially the same as that of the semiconductor element 1. That is, the size of the carrier 32 is within ±10%, ±5%, ±4%, ±3%, ±2, or ±1% of the size of the semiconductor element 1. The adhesive layer 30 is a double-sided tape, the size of which is substantially the same as that of the carrier 32. That is, the size of the adhesive layer 30 is within ±10%, ±5%, ±4%, ±3%, ±2, or ±1% of the size of the carrier 32. In other words, the semiconductor element 1, the adhesive layer 30, and the carrier 32 are all circular and have substantially the same size, and the three are formed into a three-layer stacked structure. It should be noted that the carrier 32 is not a hollow, annular film frame. In one embodiment, the adhesive layer 30 is a two-layer structure, wherein an upper layer is a foamed adhesive, and a lower layer is a UV adhesive. When being heated (for example, about 90° C. to 200° C.), the foamed adhesive produces gas and is cured. The UV adhesive is cured when radiated with UV light. In other embodiments, both the upper layer and the lower layer of the adhesive layer 30 are foamed adhesives, but are different in the foaming temperature; for example, the foaming temperature of the foamed adhesive of the upper layer is about 90° C., whereas the foaming temperature of the foamed adhesive of the lower layer is about 150° C. In yet other embodiments, other single layer or multi-layer adhesives may alternatively be used.

As noted with respect to FIG. 1b, the semiconductor element 1 may be in the form of a strip. For such embodiments, a carrier 32 may be a circular disk or a strip, and semiconductor element 1 in the form of the strip is attached to the carrier 32 by an adhesive layer 30 in the form of a circular disk or a strip correspondingly.

Figure 7:
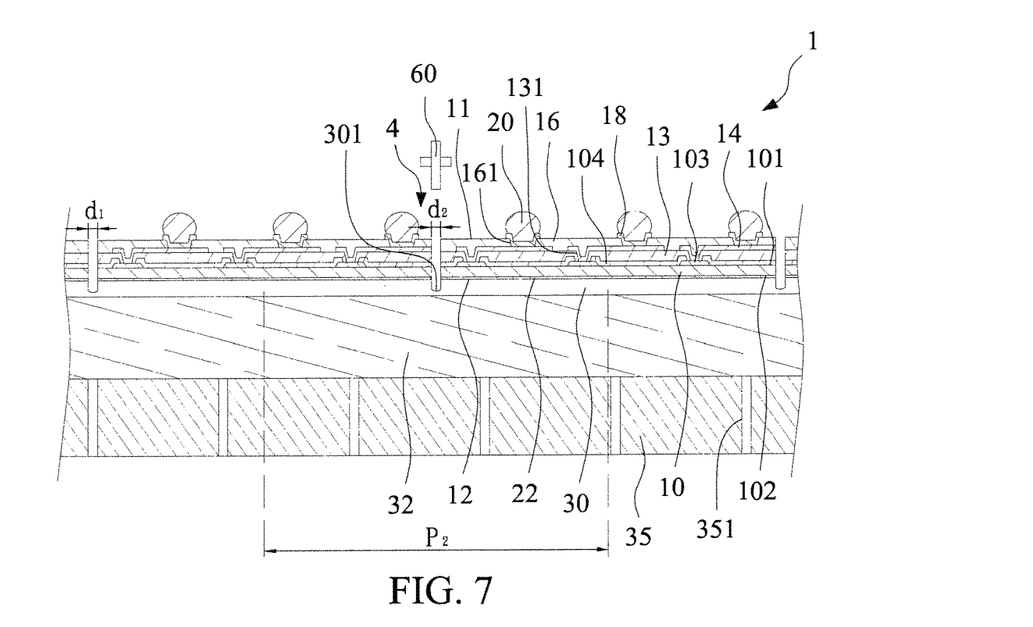

Referring to FIG. 7, a cutter 60 may be used to cut the semiconductor element 1 along the cutting lines 15 to form a plurality of semiconductor element units 4 (that is, dice). A plurality of vacuum channels 351 of a chuck 35 may be used to hold the carrier 32 in place in a vacuum manner to facilitate cutting. In one embodiment, the adhesive layer 30 is also cut; however, instead of being cut through, the adhesive layer 30 is formed with a notch 301, and the notch 301 corresponds to a gap between two semiconductor element units 4. However, it should be noted that the carrier 32 is not cut. When the semiconductor element 1 is cut, because the adhesive layer 30 is supported by the carrier 32 thereunder, it can be controlled that substantially the same second pitch $P_2$ is kept between each two of the semiconductor element units 4 after the cutting process. That is, a standard deviation of the second pitch $P_2$ across the semiconductor element units 4 is within 10%, 5%, 4%, 3%, 2, or 1% of an average value of the second pitch $P_2$ across the units 4. As shown in FIG. 7, a gap between one semiconductor element unit 4 and a neighboring semiconductor element unit 4 on the left has a width of $d_1$, and a gap between the one semiconductor element unit 4 and a neighboring semiconductor element unit 4 on the right has a width of $d_2$, wherein:

$$0 \leq |d_2 - d_1| \leq 4 \ \mu m$$

Therefore, an offset amount between the semiconductor element units 4 may be defined as $(|d_2-d_1|)$, and the offset amount is smaller than 4 μm; accordingly, substantially the same second pitch $P_2$ can be kept between each two of the semiconductor element units 4. Also, the second pitch $P_2$ is substantially the same as the first pitch $P_1$ in FIG. 1. In other words, the positions of the semiconductor element units 4 after the cutting process are substantially the same as the positions of the unit regions 17 before the cutting process, without substantial offset. That is, the second pitch $P_2$ is within ±10%, ±5%, ±4%, ±3%, ±2, or ±1% of the first pitch P1. Thus, the efficiency of a second test, as described below, may be increased.

Figure 8:
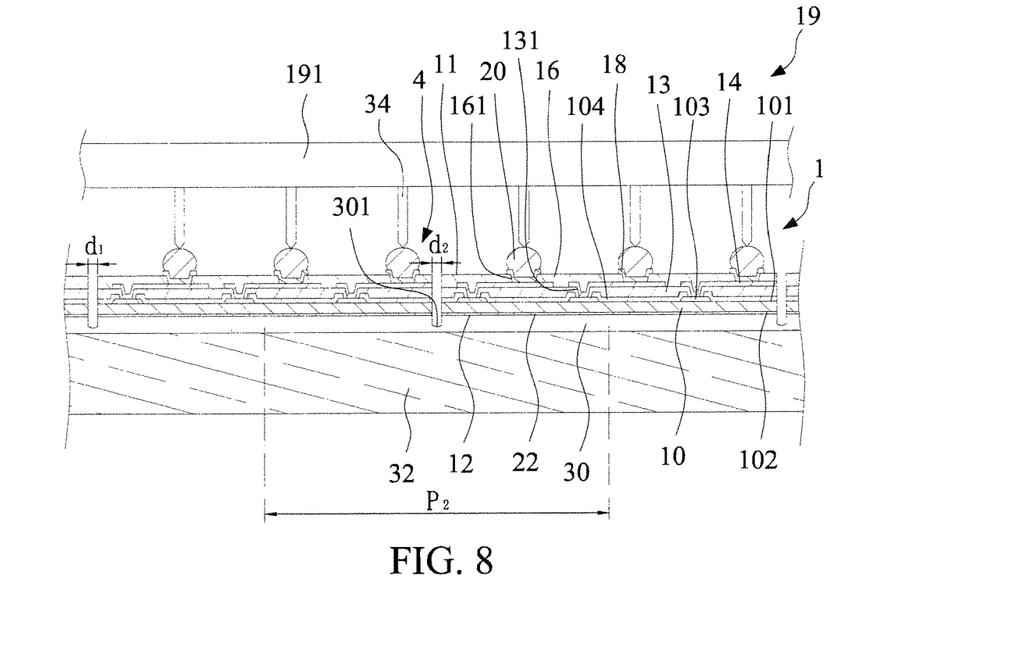

Referring to FIG. 8, a test setup for performing a second test is illustrated. In this embodiment, because a same pitch (the second pitch $P_2$) is kept between the semiconductor element units 4 after the cutting process as existed between the unit regions 17 before the cutting process, a test apparatus 19 same as that illustrated in FIG. 3a may be used to test the semiconductor element units 4. That is, the probes 34 are used to test the semiconductor element units 4 through the solder balls 20 on the semiconductor element units 4. In this embodiment, because no offset occurs in the semiconductor element units 4 after the cutting process, in the second test, the number of the semiconductor element units 4 tested by the test apparatus 19 is the same as the number of the unit regions 17 tested by the test apparatus 19 in the first test. In this manner, the test apparatus 19 can test more semiconductor element units 4 at one time (for example, 32 semiconductor element units at one time); therefore, the UPH of a test table can be effectively enhanced. It is noted that in the cutting setup of FIG. 7, if the offset amount $(|d_2-d_1|)$ between the semiconductor element units 4 is greater than a certain amount, such as greater than 4 μm, the test apparatus 19 may not be able to test as many semiconductor element units 4 at one time (for example, may be able to test 16 semiconductor element units 4 or less at one time); and the number of the semiconductor element units 4 tested by the test apparatus 19 in the second test would therefore be different from the number of the unit regions 17 tested by the test apparatus 19 in the first test.

Figure 8A:
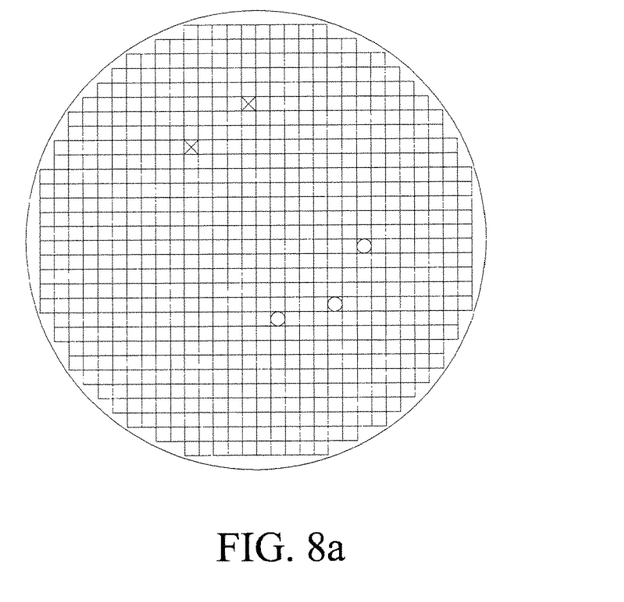

Referring to FIG. 8a, an example of a map of a test result of a second test as may be performed by the test setup illustrated in FIG. 8 is illustrated. As shown in FIG. 8a, three regions marked by "o" represent that three semiconductor element units 4 corresponding to the marked regions did not pass the electrical property testing of the second test, that is, they are defective. Since the test apparatus 19 (FIG. 8) used in the second test is the same as the test apparatus 19 (FIG. 3a) used in the first test, whether a defect mode after cutting is formed in a particular area may be determined by comparing the maps (FIGS. 3b and 8) of the test results of the two tests, and the parameters or the operation mode of the cutting table can be adjusted according the defect mode so as to enhance the yield rate after cutting.

Figure 9:
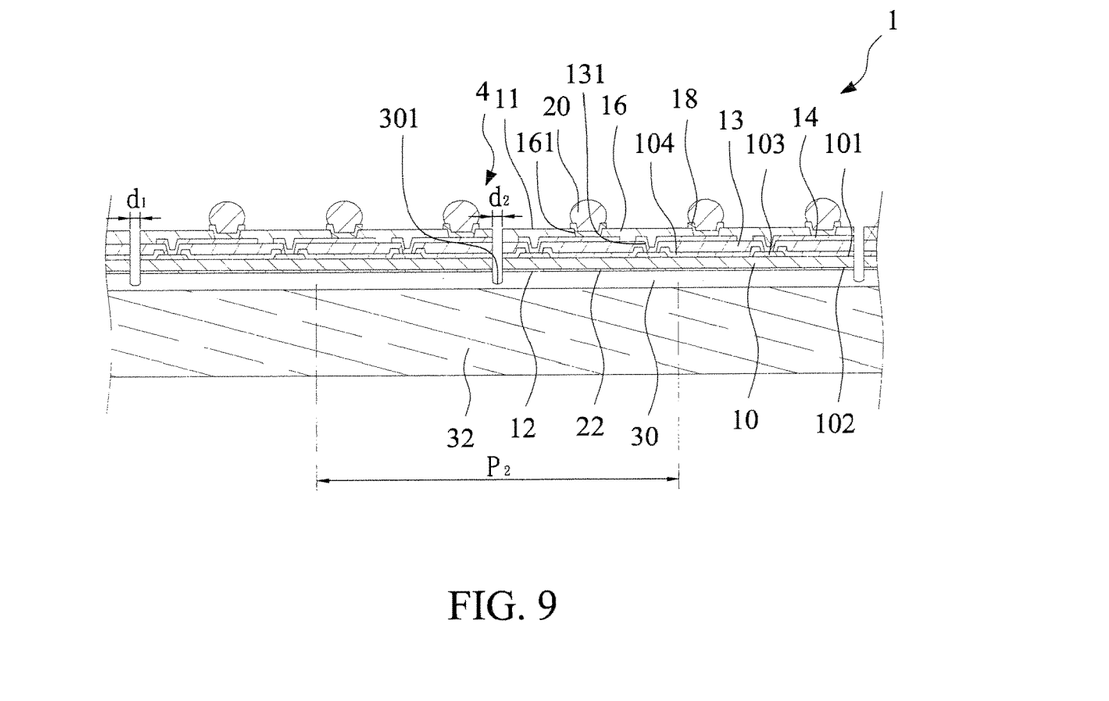

Referring to FIG. 9, a curing is performed to release the adhesiveness of the adhesive layer 30, such as by application of high temperature or radiation of UV light. In this case, the semiconductor element units 4 and the adhesive layer 30 remain on the carrier 32.

Figure 10:
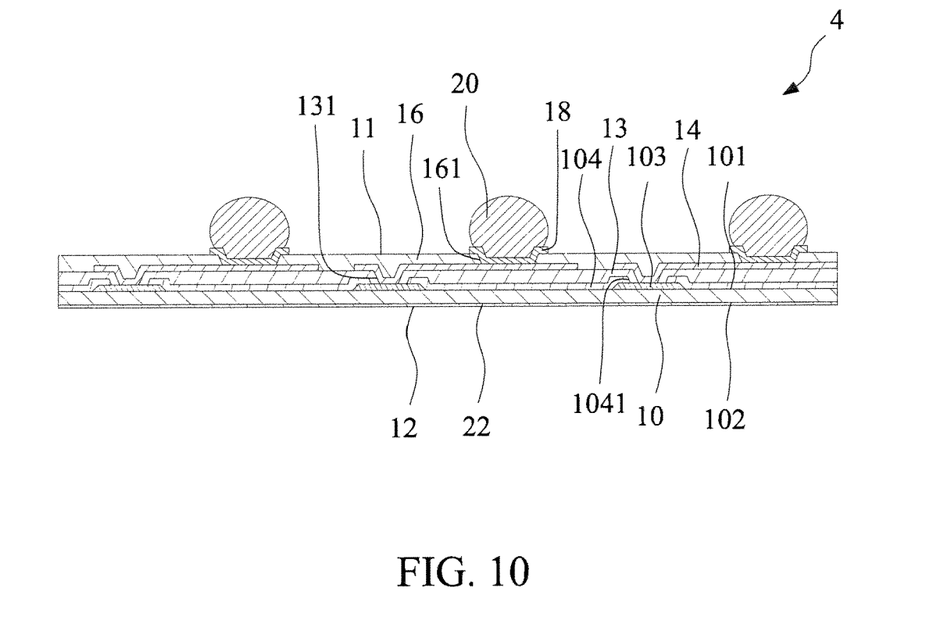

Referring to FIG. 10, the semiconductor element units 4 are removed from the carrier 32 and adhesive layer 30 (which is no longer adhesive), resulting in individual semiconductor element units 4, as shown in FIG. 10 for one semiconductor element unit 4.

FIG. 11 to FIG. 16 are schematic views of a method of attaching the semiconductor element to the carrier according to an embodiment of the present disclosure. Three techniques of attaching the semiconductor element to the carrier are as follows: in the first technique, the adhesive layer 30 is first attached to the rear surface 12 of the semiconductor element 1, and subsequently the carrier 32 is attached to the adhesive layer 30; in the second technique, the adhesive layer 30 is first attached to the carrier 32, and subsequently the rear surface 12 of the semiconductor element 1 is attached to the adhesive layer 30; and in the third technique, the rear surface 12 of the semiconductor element 1, the adhesive layer 30, and the carrier 32 are pressed together simultaneously. The first technique is described by way of example below.

Figure 11:
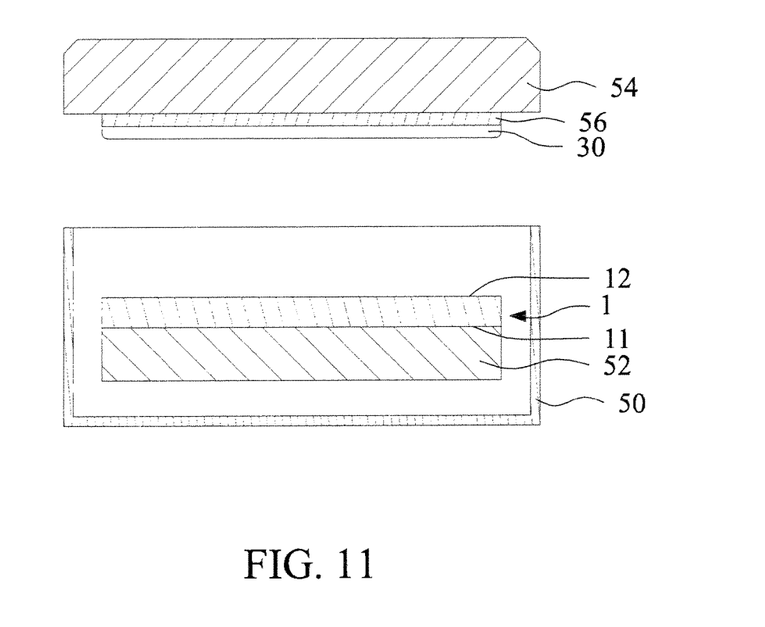
FIG. 11, FIG. 12, FIG. 13, FIG. 14, FIG. 15, and FIG. 16 are schematic views of a method of attaching the semiconductor element to the carrier according to an embodiment of the present disclosure.

Referring to FIG. 11, an accommodating groove 50 and an upper cover 54 are provided. The accommodating groove 50 defines an accommodating space, in which a chuck 52 is provided. The semiconductor element 1 is placed in the accommodating space and is located on the chuck 52, wherein the rear surface 12 of the semiconductor element 1 is upwards. A balloon 56 is provided below the upper cover 54. In this case, the balloon 56 is substantially flat, and the adhesive layer 30 is attracted to the balloon 56 by using static electricity.

Figure 12:
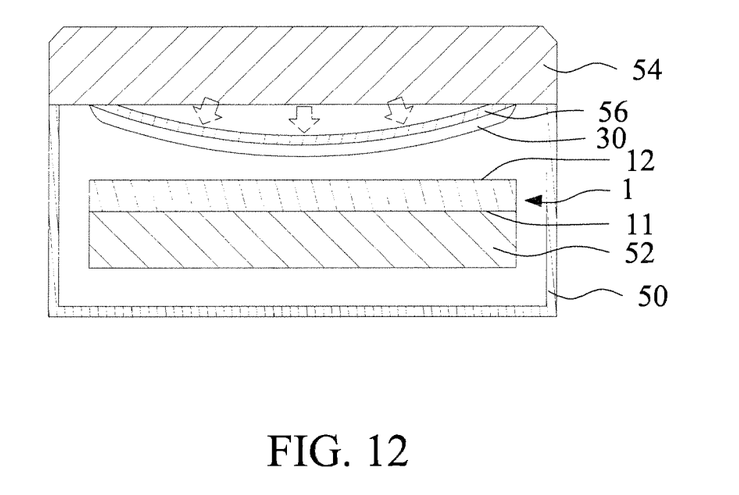

Referring to FIG. 12, the upper cover 54 and the accommodating groove 50 are closed tightly, so that the accommodating space is formed into an enclosed space. Next, a vacuum is produced in the accommodating space, so that the balloon 56 along with adhesive layer 30 bulge downwards and acquire arcuate shapes due to a pressure difference.

Figure 13:
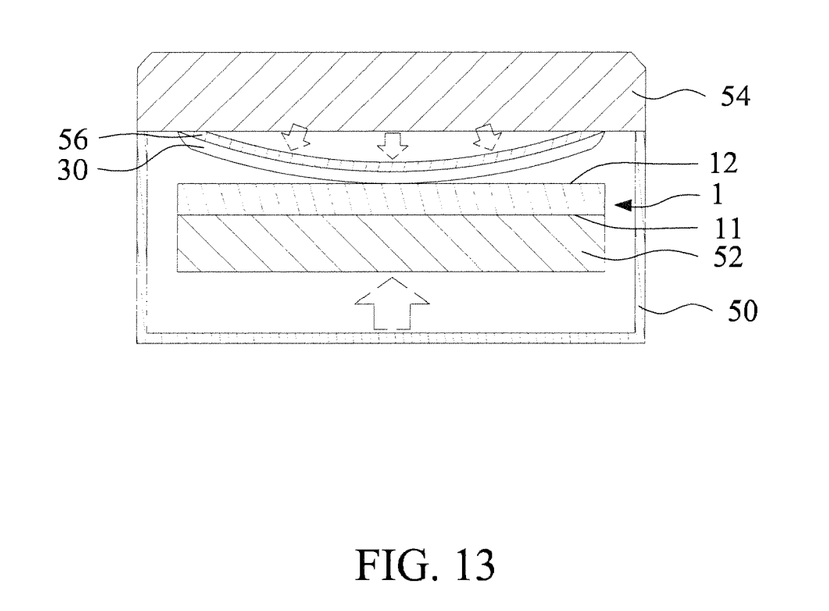

Referring to FIG. 13, the chuck 52 moves upwards, so that the adhesive layer 30 first contacts a middle position of the rear surface 12 of the semiconductor element 1. With the chuck 52 moving upwards, the adhesive layer 30 gradually makes contact with the rear surface 12 of the semiconductor element 1 until complete attachment. Subsequently, the vacuum is released and the upper cover 54 is opened. The attachment of the adhesive layer 30 to the rear surface 12 of the semiconductor element 1 is stronger than the attachment of the adhesive layer 30 to the balloon by way of static electricity; therefore, the balloon 56 and the adhesive layer 30 separate when the upper cover 54 is opened.

Figure 14:
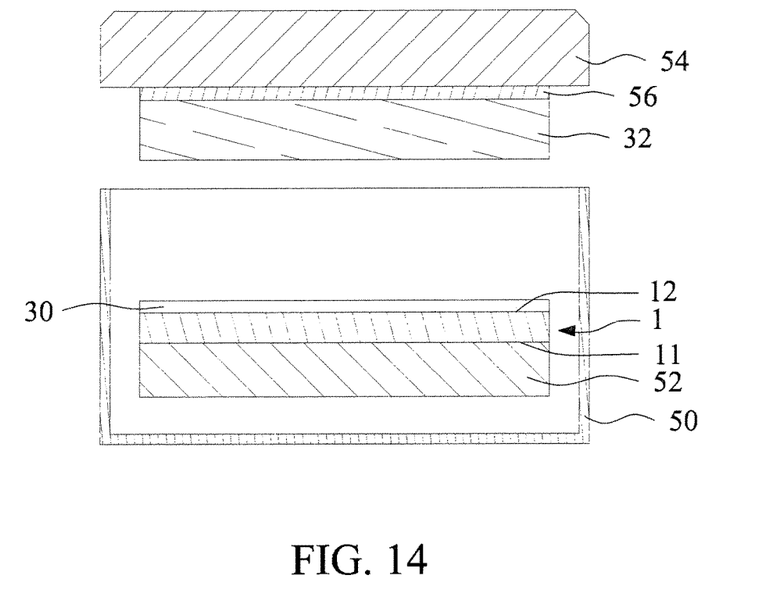

Referring to FIG. 14, in the next part of the first technique, the carrier 32 is attached to the adhesive layer 30. It should be noted that the accommodating groove 50 and the upper cover 54 in FIG. 14 may be the same as or different from the accommodating groove 50 and the upper cover 54 in FIG. 11 to FIG. 13. A balloon 56 is provided below the upper cover 54. A carrier 32 is attracted to the balloon 56 by using static electricity. The balloon 56 and the carrier 32 are initially substantially flat.

Figure 15:
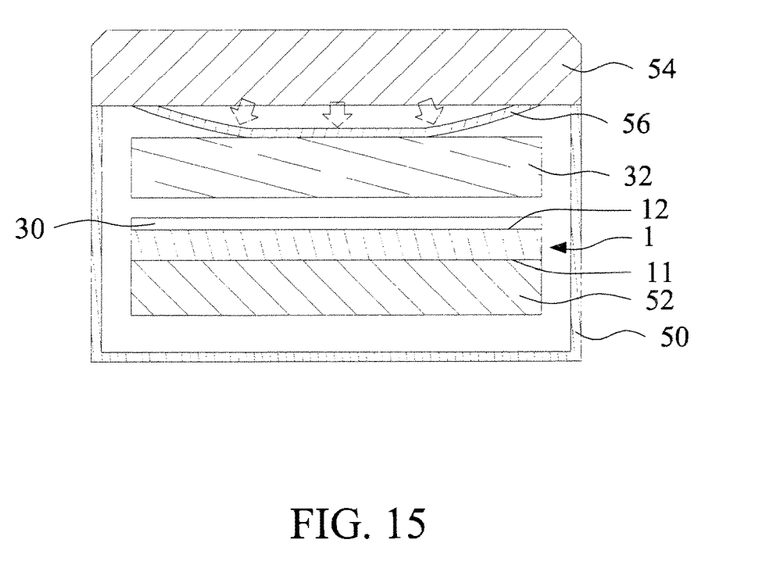

Referring to FIG. 15, the upper cover 54 and the accommodating groove 50 are closed tightly, so that the accommodating space is formed into an enclosed space. Next, a vacuum is produced in the accommodating space, so that the balloon 56 bulges downwards and acquires an arcuate shape due to a pressure difference. Meanwhile, the carrier 32 retains a flat form, that is, a periphery of the carrier 32 separates from the balloon 56, as illustrated in FIG. 15.

Figure 16:
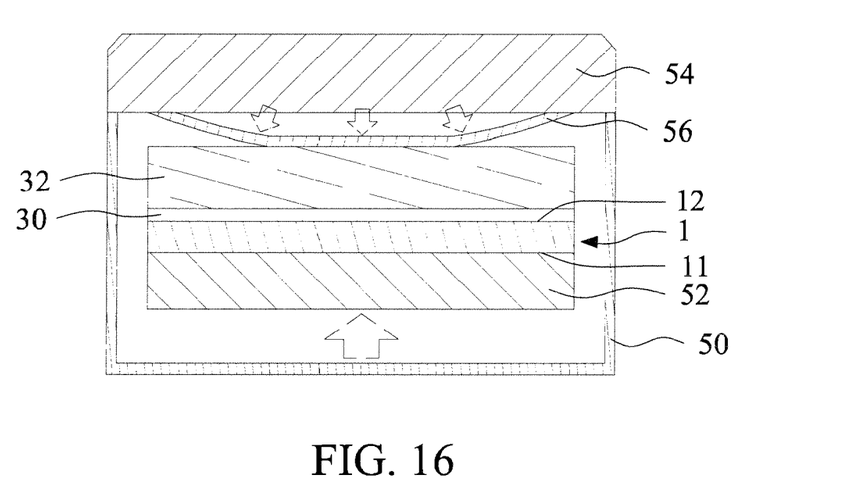

Referring to FIG. 16, the chuck 52 moves upwards, so that the carrier 32 is directly attached to the adhesive layer 30. Subsequently, the vacuum is released and the upper cover 54 is opened, so as to take out the three-layer structure of carrier 32, adhesive layer 30, and semiconductor element 1.

As mentioned for the embodiment of FIG. 6, the carrier 32 is not a film frame. Therefore, after cutting (FIG. 7), the semiconductor element units 4 are not pulled apart to produce a position offset, that is, the positioning of the semiconductor element units 4 is fixed before and after the cutting process and does not substantially change; also, the size of the semiconductor element 1 before and after the cutting process is substantially the same. Thereby, a common table for testing a wafer may be used in the test setups of FIG. 3a and FIG. 8, which not only can test multiple semiconductor element units 4 simultaneously, but also does not require the use of a specific, expensive table. In addition, this embodiment can effectively reduce defects in the process, thereby improving an overall yield of assembly and test, and reducing costs of assembly and test.

In addition, in another embodiment, a plurality of dice located at a tape and reel package may be picked back on the carrier 32, and are fixed at the carrier 32 by using the adhesive layer 30. By arranging the dice into a wafer form, subsequently a common table for testing a wafer may be used to perform a test.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A device, comprising:
an accommodating groove defining an accommodating space, the accommodating groove including a chuck;
an upper cover disposed above the accommodating groove;
a balloon disposed on the upper cover and between the accommodating groove and the upper cover; and
an adhesive layer attached directly on to the balloon;
wherein the balloon is configured to bulge by a pressure difference between the balloon and the accommodating space.

2. The device according to claim 1, wherein the accommodating groove and the upper cover are configured to close tightly, and the device is configured to produce a vacuum in the accommodating space of the accommodating groove.

3. The device according to claim 1, wherein a pressure in the balloon is greater than a pressure in the accommodating space of the accommodating groove.

4. The device according to claim 1, wherein the balloon is configured to bulge gradually toward the chuck.

5. The device according to claim 4, wherein the chuck is configured to move toward the balloon.

6. The device according to claim 1, wherein the chuck is sized to accommodate a semiconductor wafer.

7. A device, comprising:
a chuck;
a cover disposed above the chuck;
a balloon connected to the cover and facing the chuck; and
an adhesive layer attached directly on to the balloon;
wherein the device is configured to apply a pressure difference to cause the balloon to bulge.

8. The device according to claim 7, wherein the chuck is configured to move toward the balloon.

9. The device according to claim 7, further comprising an accommodating groove defining an accommodating space, wherein the chuck is disposed in the accommodating space.

10. The device according to claim 9, wherein the accommodating groove and the cover are configured to close, and the device is configured to produce a vacuum in the accommodating space of the accommodating groove.

11. The device according to claim 10, wherein the device is configured to apply the pressure difference such that a pressure in the balloon is greater than a pressure in the accommodating space of the accommodating groove.

12. The device according to claim 7, wherein the device is configured to apply the pressure difference to cause the balloon to attain an arcuate shape.

13. The device according to claim 7, wherein the chuck is sized to accommodate a semiconductor wafer.

14. A device, comprising:
an accommodating groove defining an accommodating space;
a chuck disposed in the accommodating space; and
a cover including a balloon facing the chuck and an adhesive layer attached directly on to the balloon;

wherein the cover is configured to enclose the accommodating space.

15. The device according to claim 14, wherein the device is configured to produce a vacuum in the accommodating space of the accommodating groove.

16. The device according to claim 14, wherein the device is configured to apply a pressure difference to cause the balloon to bulge.

17. The device according to claim 16, wherein the balloon is configured to bulge toward the chuck.

18. The device according to claim 14, wherein the device is configured to apply a pressure difference to cause the balloon to attain an arcuate shape.

19. The device according to claim 14, wherein the chuck is configured to move toward the cover.

20. The device according to claim 14, wherein the chuck is sized to accommodate a semiconductor wafer.

* * * * *